United States Patent [19]

Ogawa et al.

[11] Patent Number: 4,988,631
[45] Date of Patent: Jan. 29, 1991

[54] METHOD OF MAKING A PHOTOELECTRIC CONVERSION DEVICE

[75] Inventors: Minoru Ogawa; Koichiro Sakamoto; Toshiyuki Tamura; Kazushige Katsuumi, all of Shizuoka, Japan

[73] Assignee: Tokyo Electric Co., Ltd., Tokyo, Japan

[21] Appl. No.: 514,263

[22] Filed: Apr. 25, 1990

Related U.S. Application Data

[60] Division of Ser. No. 331,079, Mar. 28, 1989, Pat. No. 4,979,007, which is a continuation of Ser. No. 61,667, Jun. 15, 1987, abandoned.

[30] Foreign Application Priority Data

Jun. 17, 1986 [JP] Japan .................. 61-140628
May 15, 1987 [JP] Japan .................. 62-119349

[51] Int. Cl.5 .................. H01L 27/14; H01L 27/12
[52] U.S. Cl. .................. 437/4; 437/916; 437/2; 437/3; 357/19; 357/23.7; 357/2; 357/29; 357/30
[58] Field of Search .................. 437/916, 2, 3, 4; 357/19, 23.7, 2, 29, 30

[56] References Cited

U.S. PATENT DOCUMENTS

| 4,332,174 | 6/1982 | Suzuki et al. |
| 4,432,247 | 2/1984 | Takeno et al. |
| 4,461,956 | 7/1984 | Hatanaka .................. 250/578 |
| 4,511,877 | 4/1985 | Nishikawa et al. |
| 4,581,099 | 4/1986 | Fukaya et al. .................. 437/3 |
| 4,582,395 | 4/1986 | Morozumi .................. 357/2 |
| 4,587,720 | 5/1986 | Chenevas-Paule et al. .................. 432/56 |
| 4,628,296 | 12/1986 | Kitagawa et al. |
| 4,630,491 | 12/1986 | Kitagawa et al. |
| 4,888,632 | 12/1989 | Haller .................. 357/2 |
| 4,889,983 | 12/1989 | Numano et al. .................. 357/2 |

FOREIGN PATENT DOCUMENTS

| 2915024 | 10/1979 | Fed. Rep. of Germany ...... 357/237 |
| 122775 | 7/1953 | Japan .................. 357/30 |
| 145467 | 11/1980 | Japan .................. 357/237 |
| 0143373 | 4/1984 | Japan .................. 437/2 |
| 192370 | 9/1985 | Japan .................. 357/30 |
| 0088360 | 4/1987 | Japan .................. 437/2 |
| 0021954 | 1/1989 | Japan .................. 437/2 |
| 0072556 | 5/1989 | Japan .................. 437/2 |
| 0136364 | 5/1989 | Japan .................. 437/2 |

Primary Examiner—Brian E. Hearn
Assistant Examiner—Gordon V. Hugo
Attorney, Agent, or Firm—Oblon, Spivak, McClelland, Maier & Neustadt

[57] ABSTRACT

The present invention, in a photoelectric conversion device including a sensor portion and a thin film transistor portion for the purpose of switching disposed on the same substrate, is manufactured by, first, forming gate electrodes for a thin film transistor portion on the surface of the substrate by a thin film technique, and then, depositing an insulating film, an a-Si film, and electrodes on the insulating substrate so as to be laminated to one after another and commonly covering the sensor portion and the thin film transistor portion, whereby the sensor portion and the thin film transistor portion are enabled to be provided in one series of processing while the device is put in a vacuum chamber.

5 Claims, 9 Drawing Sheets

METHOD OF MAKING A PHOTOELECTRIC CONVERSION DEVICE

This is a division of application Ser. No. 07/331,079, filed on Mar. 28, 1989, U.S. Pat. No. 4,979,007, which is a continuation of Ser. No. 061,667 filed Jun. 15, 1987, abandoned.

FIELD OF THE INVENTION AND RELATED ART STATEMENT

The present invention relates to an elongate photoelectric conversion device for use in image reading etc. and more particularly to such a device of the structure in which the sensor portion and the thin film transistor portion for switching operation are formed on the same substrate.

Recently, an elongated thin film photoelectric conversion element array has come into use as a photoelectric conversion device for reading image data without using a scale-down optical system.

As representative types of the sensor portion in the thin film photoelectric conversion element array, there are the so-called sandwich type and planer type. The former, the sandwich type of photoelectric conversion element is such as is employing amorphous silicon (a-Si) for the photoconductive member and of the construction having the amorphous silicon member sandwiched between a transparent electrode and a metallic electrode. The latter, the planer type of photoelectric conversion element is structured such that a photoconductive material is deposited in the form of film on an insulating substrate and an array of counter electrodes are disposed flat against the insulating substrate.

And, in addition to such a sensor portion, an IC or thin film transistor portion is used as a switching portion for the sensor portion, and these portions as a whole provide a photoelectric conversion device. There have also been ones constructed by having an IC or thin film transistor portion disposed adjacent to the sensor portion. For example, an art of such construction is described in the publication of Japanese Patent Laid-open No. 61-89661/1986. The one of such structure will be described with reference to FIG. 14. On an insulating substrate 50 of glass substrate or the like, there are disposed thin film transistors TFT and Schottky diodes D side by side in the form of films. The method for forming the same will be described below. First, gate electrodes 51 are formed on the insulating substrate 50. Then, a gate insulating film 52, a-Si film 53, and an insulating film 54 for protecting a channel portion are provided in succession in the form of films by glow discharge decomposition method. Thereafter, the insulating film 54 is removed by etching except the portion for the channel portion. In succession thereto, an n+ a-Si film 55 is deposited. Then, after an electrode material has been deposited on the entire surface by evaporation, source and drain electrodes 56a, 56b are formed by a photolithographic process. Further, after an SiO$_2$ film for protecting the thin film transistors TFT has been deposited, the same is subjected to a patterning process to be made into a protecting film 57. Thus, the thin film transistors TFT are provided. After the thin film transistors TFT have been made, the Schottky diodes D are provided. That is, transparent electrodes 58 are provided in the form of films adjacent to the thin film transistors TFT. Then, an a-Si thin film 59 is deposited and subjected to patterning so as to partially overlap the transparent film 58, and thus, the Schottky diodes D are provided. Finally, electrode members are provided in the form of thin films to connect the drain electrode 56a of the thin film transistor TFT and the transparent electrode 58 of the Schottky diode D.

Problems encountered in such prior art will now be described. The thin film transistor TFT and the Schottky diode D are different in film structure. Therefore, the thin film transistor TFT portion and the Schottky diode portion D must be fabricated individually, and therefore, the manufacturing process of the whole body becomes complex.

Then, as the photoelectric conversion device that will be manufacturable through a process simplified to a certain degree, one of such construction as will be fabricated through the following process is contemplated, as to which description will be given below referring to FIGS. 15 and 16. First, after such metal as Cr, Ti, and Mo is deposited on the insulating substrate 1 by evaporation, sputtering, or the like, gate electrodes 2 are formed by a photolithographic process. Then, a photoconductive film 3 of a-Si is deposited only on the sensor portion A by masked plasma CVD, masked sputtering, or the like. And, in the thin film transistor portion B where the above mentioned gate electrodes 2 are formed, a gate insulating film 4 of SiO$_x$, SiN$_x$, or the like, an a-Si film 5, and an n+ a-Si film 6 are deposited on the gate electrode 2 by a plasma CVD process. Then, the sensor portion A and the thin film transistor portion B are covered with a film of Cr, Ti, Mo, or the like by evaporation, and counter electrodes 7 for the sensor portion A and source electrodes 8 and drain electrodes 9 for the thin film transistor portion B are formed by the photolithographic process.

Incidentally, in the described manufacture, whichever may be carried out first for the film formation for the sensor portion A and then for the thin film transistor portion B.

The above described construction is simpler the film structure of the prior art in FIG. 14 for example especially with respect to both the sensor portion A and the thin Film transistor portion B. Therefore, it can be said that this type of construction is much easier to manufacture. But, there is no difference between this type and the type formed by the construction described in FIG. 14 in that the sensor portion A and the thin film transistor portion B are of different film structures. Therefore, it provides no solution to the problem of the complexity of the overall manufacturing process because of the individual formation of the sensor portion A and the thin film transistor portion B. Further, since the sensor portion A and the thin film transistor portion B are formed individually by the masked CVD method or the like, when an elongated device is to be processed, the mask because very long and narrow, and therefore, there occurs a problem of the mask becoming distorted causing, for example, an outward leak. Hence, there arises a question of difficulty in miniaturizing the pattern for providing the sensor portion A with high resolution.

OBJECT AND SUMMARY OF THE INVENTION

A first object of the present invention is the provision, in a photoelectric conversion device of the type having a sensor portion and a thin film transistor portion formed on the same substrate, of one which will be manufactured through a simplified process.

A second object of the present invention is the provision, in a photoelectric conversion device of the type having a sensor portion and a thin film transistor portion formed on the same substrate, of one of which the sensor portion having high resolution will be easily fabricated.

A third object of the present invention is the provision, in a photoelectric conversion device of the type having a sensor portion and a thin film transistor portion formed on the same substrate, of one in which the problem of runabout currents in its sensor portion will be solved.

A fourth object of the present invention is the provision, in a photoelectric conversion device of the type having a sensor portion and a thin film transistor portion formed on the same substrate, of one in which the sensitivity of its sensor portion will be improved.

In order to achieve the above enumerated objects, the device according to the present invention is constructed such that, at first, gate electrodes for a thin film transistor portion are formed by a thin film technique on the surface of a substrate, and then, on the portion in the surface of the substrate where the sensor portion and the thin film transistor portion are to be formed, an insulating film, an a-Si film, and electrodes for the sensor portion and the thin film transistor portion are commonly deposited in layers. Therefore, if only the gate electrodes are provided in advance in the form of films on the thin film transistor portion, then, the insulating film, a-Si film, and the electrodes can be deposited commonly with respect to the sensor portion and the thin film transistor portion. Thus, the film forming is simplified and the manufacturing becomes easier. Further, masking at the time of film formation becomes unnecessary.

DESCRIPTION OF THE PREFERRED EMBODIMENTS

Figure 1:
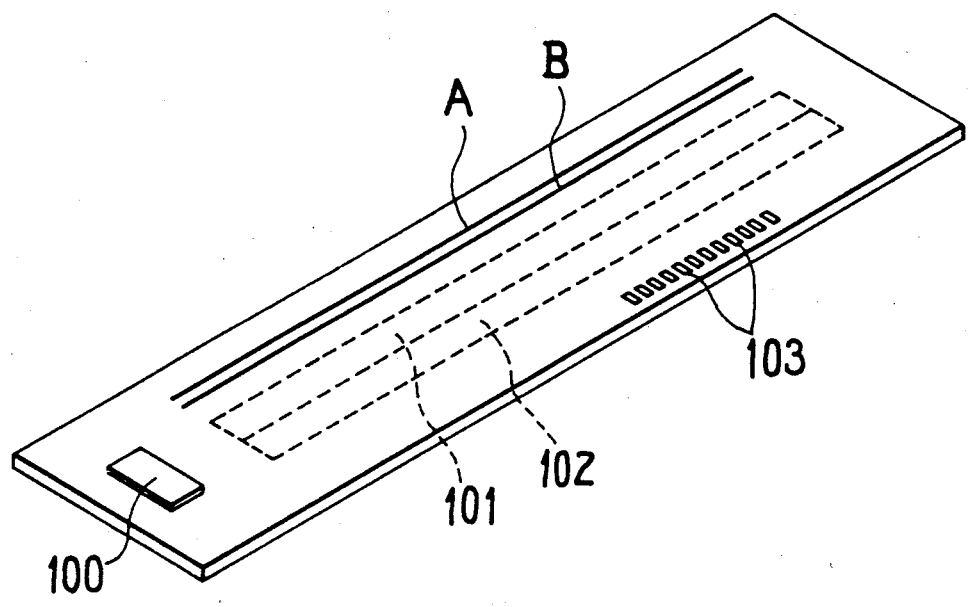
FIG. 1 is a perspective view showing overall arrangement of a first embodiment of the present invention.

A first embodiment of the present invention will be described below with reference to FIG. 1 to FIG. 5. FIG. 1 shows a perspective view of entire device, in which a sensor portion A and a thin film transistor portion B in the form of arrays are disposed in parallel with each other on an insulating substrate 10 as a board. On the insulating substrate 10, there are also disposed a transistor driving IC 100, a gate wiring pattern 101, a wiring pattern under the matrix 102, and a plurality of terminals 103. With these parts connected to the sensor portion A and the thin film transistor portion B, an electric circuit is constituted.

Figure 2:
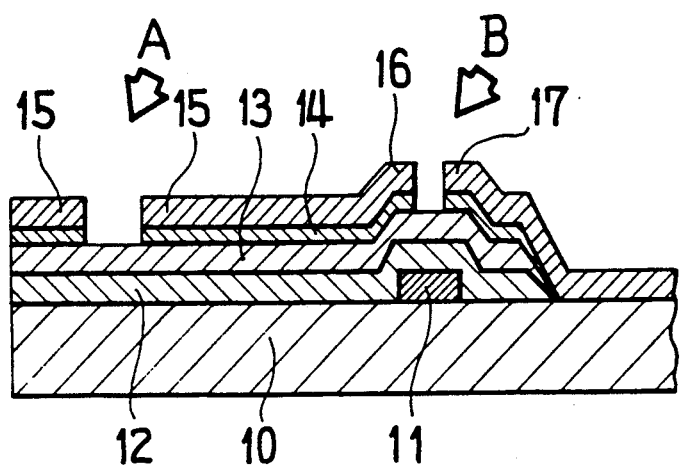
FIG. 2 is a vertical sectional side view showing sensor portion and thin film transistor portion.
Figure 3:
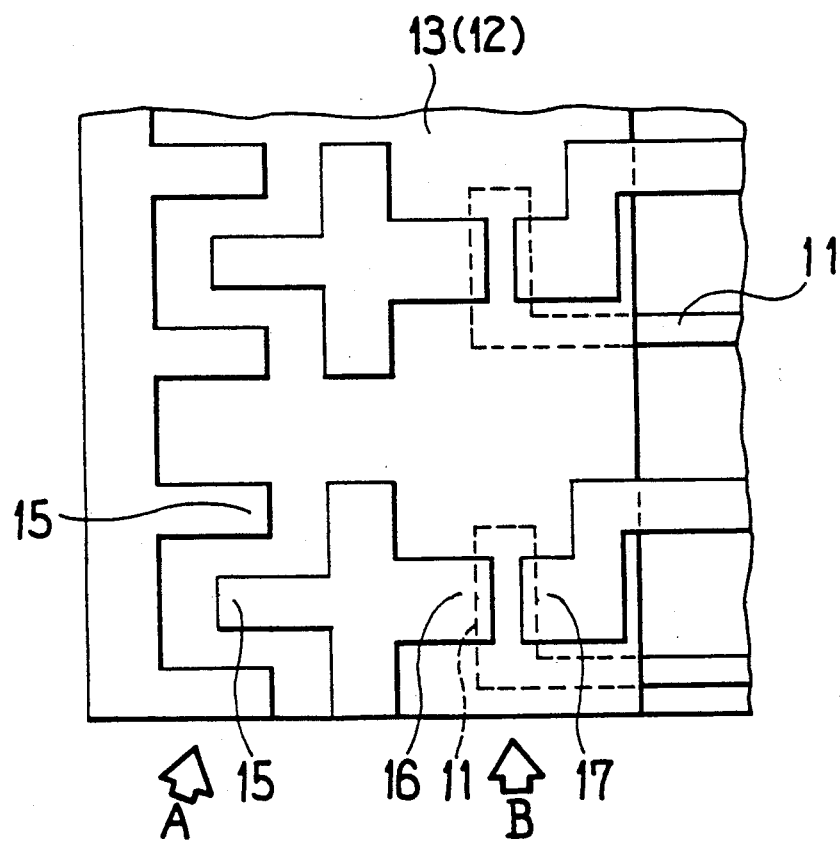
FIG. 3 is a plan view of the same.

Now, description will be made on the manufacturing process of the sensor portion A and thin film transistor portion B with reference to FIG. 2 and FIG. 3. First, such metal as Cr, Ti, and Mo is deposited in the form of a film on the insulating substrate 10 by evaporation, sputtering, or the like, and then gate electrodes 11 for the thin film transistor portion B are formed by a photolithographic process. Then, a continuous insulating film 12 of $SiN_x$, $SiO_x$, or the like is deposited by plasma CVD, sputtering, or the like on the surface commonly covering the sensor portion A and the thin film transistor portion B, and thereon is deposited an a-Si film 13 having the same pattern as the $SiN_x$ film and having a uniform thickness. Further, on this a-Si film 13 is deposited an $n^+$ a-Si film 14 for betterment of the ohmic contact therewith of later described electrodes. On the same, a film of Ti, Mo. Cr, or the like becoming the upper electrodes is provided, wherefrom counter electrodes 15, source electrodes 16, and drain electrodes 17 are formed, and the $n^+$ a-Si film 14 is removed at the sensor portion A and the thin film transistor portion B by dry etching or the like.

With such construction, the described device is characterized in that in its manufacturing process each film is formed at the same time for both the sensor portion A and the thin film transistor portion B and all the films are formed in one time of its being put in a vacuum chamber. Although the insulating film 12 is deposited on the sensor portion A, the insulating film 12 is not necessary for it in general. But it is not a problem if it is present there since there is such a result obtained that the photoconductive characteristic is even bettered when underlaid by $SiN_x$ or the like.

However, since the a-Si film 13 at the sensor portion A and the a-Si film 13 at the thin film transistor portion B is of the same thickness, there arises a problem that, when the thickness of the a-Si film 13 is made thinner so as to be suitable for the thin film transistor portion B, the sensitivity at the sensor portion A is thereby lowered. Normally, the thickness of the thin film transistor portion B is 3000 Å, while the thickness of the sensor portion A is 1 μm. Therefore, the thickness of the thin film transistor portion B is set toward it is increased, so that setting is made to an optimum value with regard to speed, ON/OFF ratio, ON voltage, etc. of the thin film transistor portion B and the sensitivity of the sensor portion A, by mutual concessions. Concretely, the thickness of the a-Si film 13 is made to be 0.6 μm or above.

Figure 4:
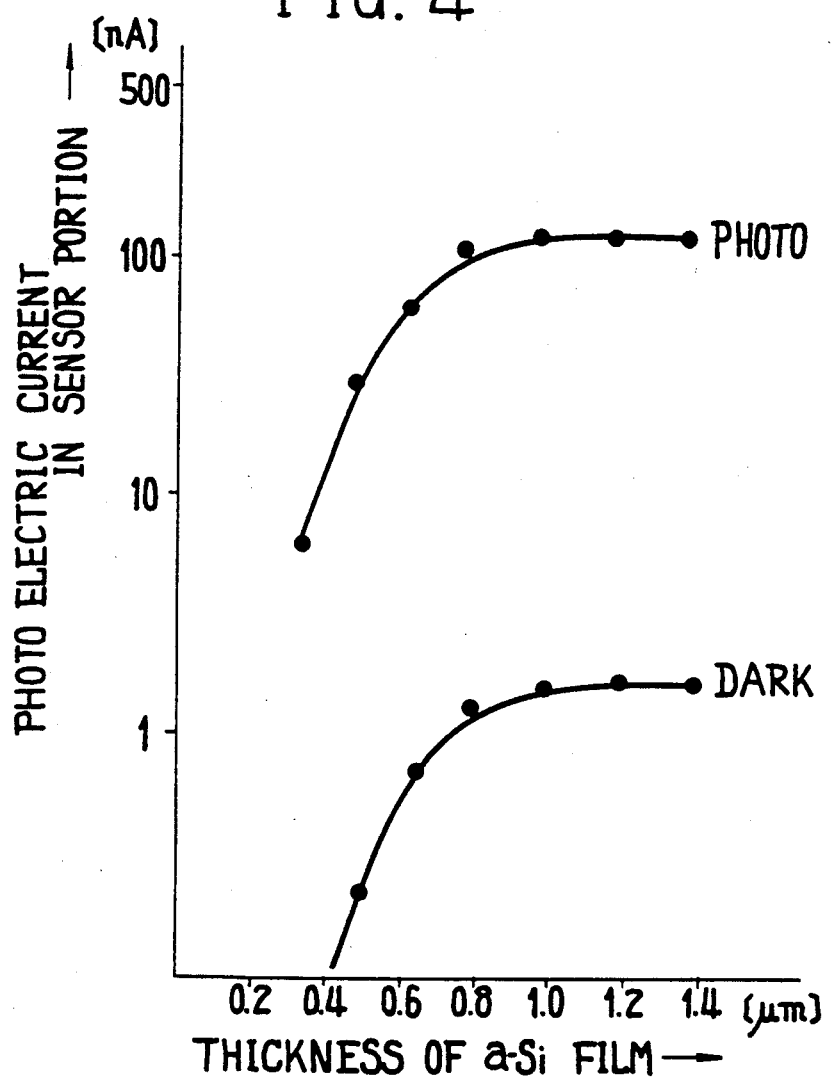
FIG. 4 is a graph showing relationship between thickness of an a-Si film and photoelectric current in the sensor portion.
Figure 5:
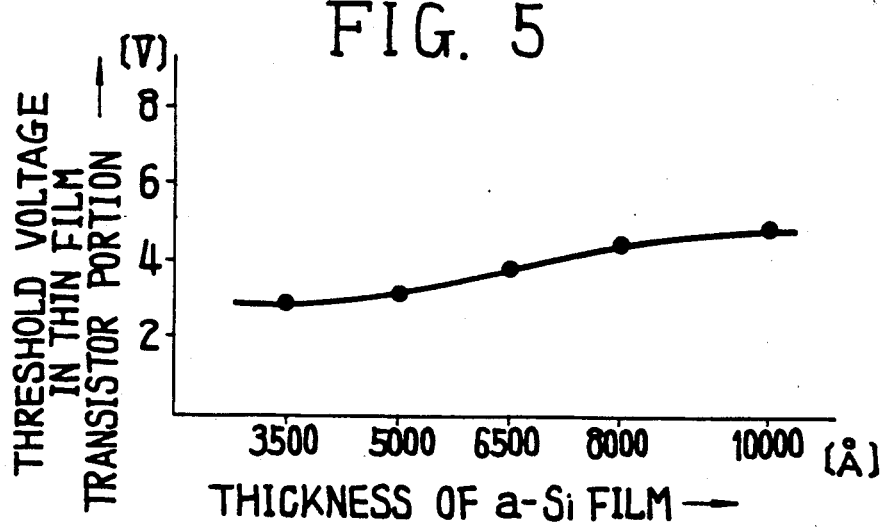
FIG. 5 is a graph showing relationship between thickness of an a-Si film and threshold voltage in the thin film transistor portion.

The ground on which the thickness 0.6 μm or above is considered appropriate will be described in accordance with the graphs of measured values in FIG. 4 and FIG. 5. The graph in FIG. 4 is that showing relationship between the thickness of the a-Si film 13 and the photoelectric current in the sensor portion A at an illuminance of 30 1×under a bias voltage of 5 V. The curve denoted by "Photo" indicates the values at the time illuminated and that denoted by "Dark" indicates the values at the time not illuminated. As apparent from the graph, under the "Photo" condition, a photoelectric current of a considerable value of 60 nA is obtained when the film thickness is 0.6 μm. But, when the thickness becomes smaller than that, a sufficient amount of photoelectric current is not obtained. Therefore, it is known that the thickness of the a-Si film 13 for the sensor portion A must be 0.6 μm or above. As to the thin film transistor portion B, on the other hand, it has been known that the $I_D$ - $V_G$ characteristic is not affected so much by the thickness of the a-Si film 13, though it is not shown by a graph. For example, the $I_D$ - $V_G$ characteristic suffers virtually no change in the range of the thicknesses of the a-Si film 13 from 3500 Å to 10000 Å. In FIG. 5 is shown relationship between threshold voltage in the thin film transistor portion B and the thickness of the a-Si film 13. As apparent from this graph, there is no large change in the threshold voltage in the range of the thicknesses of the a-Si film 13 from 3500 Å to 1000 Å. That is, influence from the thickness of the a-Si film 13 on either the $I_D$-$V_G$ characteristic or the threshold voltage is very small. Therefore, in determining the thickness of the a-Si film 13, suitability for the sensor portion A was preferentially considered and the above mentioned value 0.6 μm or above was found to be appropriate.

Figure 6:
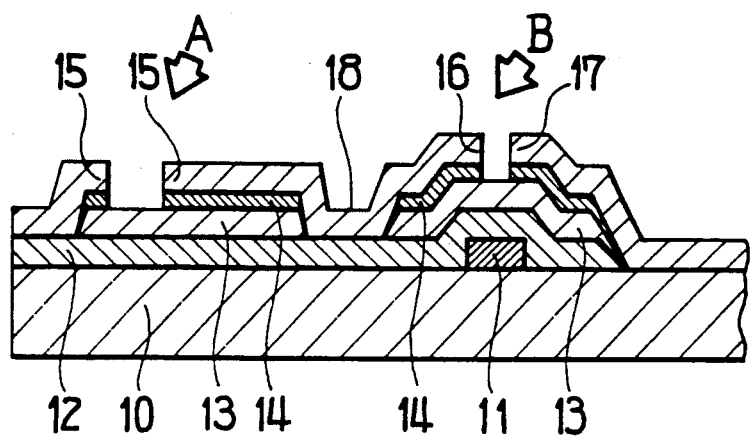
FIG. 6 is a vertical sectional side view showing sensor portion and thin film transistor portion of a second embodiment of the present invention.
Figure 7:
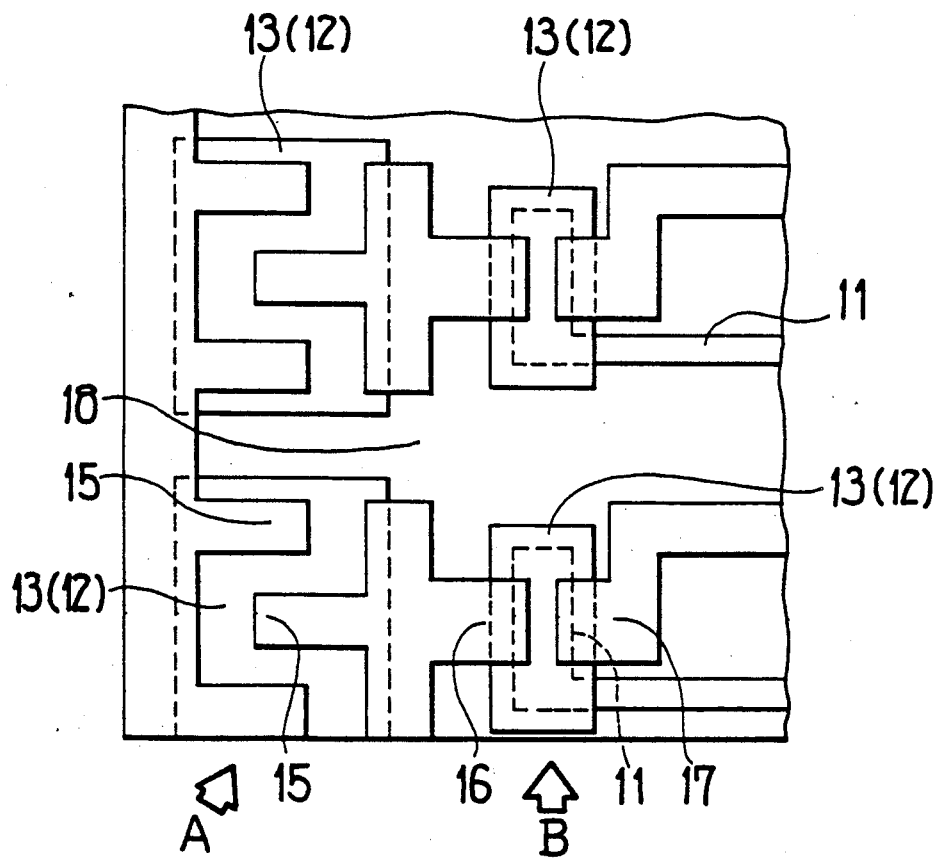
FIG. 7 is a plan view of the same.

A second embodiment of the present invention will now be described with reference to FIG. 6 and FIG. 7. The parts the same as those in the first embodiment are shown by like reference numerals and description thereof are omitted (the same will apply hereinafter). The present embodiment is provided with the aim to solve the problem of occurrence of the runabout current, which is encountered as the resolution of the sensor is raised. That is, a removed portion 18 is formed by removing by dry etching or the like the a-Si film 13 and the n+ a-Si film 14 at the portion where the same are not required for the sensor portion A and the thin film transistor portion B.

Figure 8:
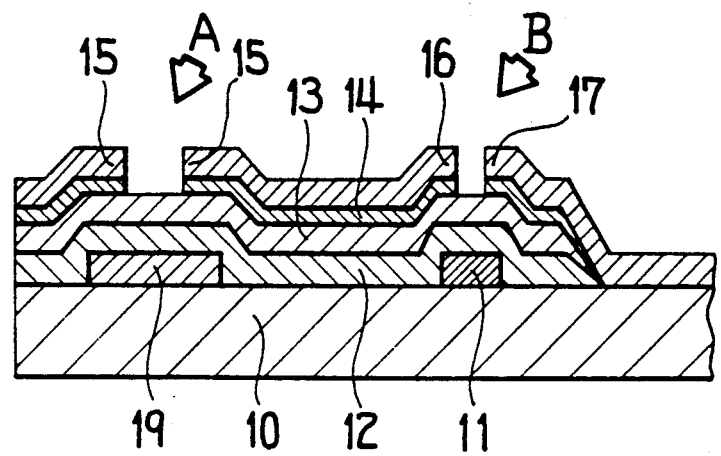
FIG. 8 is a vertical sectional side view showing sensor portion and thin film transistor portion of a third embodiment of the present invention.
Figure 9:
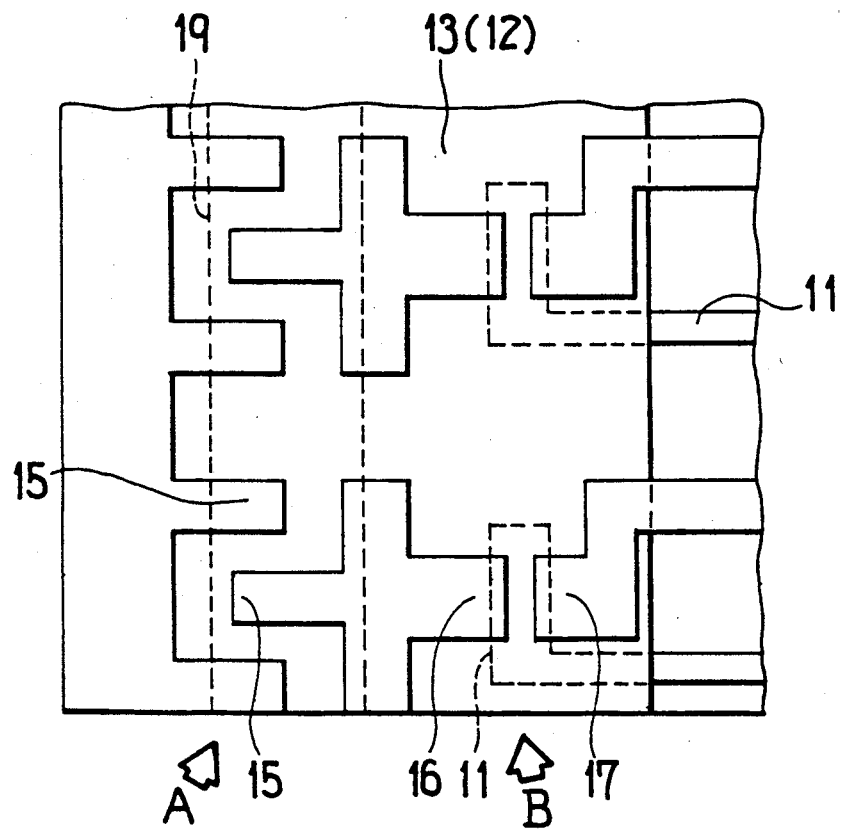
FIG. 9 is a plan view of the same.

Further, a third embodiment of the present invention will be described with reference to FIG. 8 and FIG. 9. In the present invention, a reflecting film 19 is disposed in the sensor portion A. The reflecting film 19 is deposited at the same time as the gate electrodes are deposited. That is, some portions of the metallic film of Cr, Ti, Mo, or the like deposited on the insulating substrate 10 are removed and the remaining portions are appropriated for the gate electrodes 11 and the reflecting film 19. Since the reflected light from the reflecting film 19 is also utilized, the sensitivity of the sensor portion A can be improved. Further, since the reflecting film 19 can be deposited at the same time as the gate electrodes 11, the reflecting film 19 needs not be formed by a separate process for itself and is easy to form.

Figure 10:
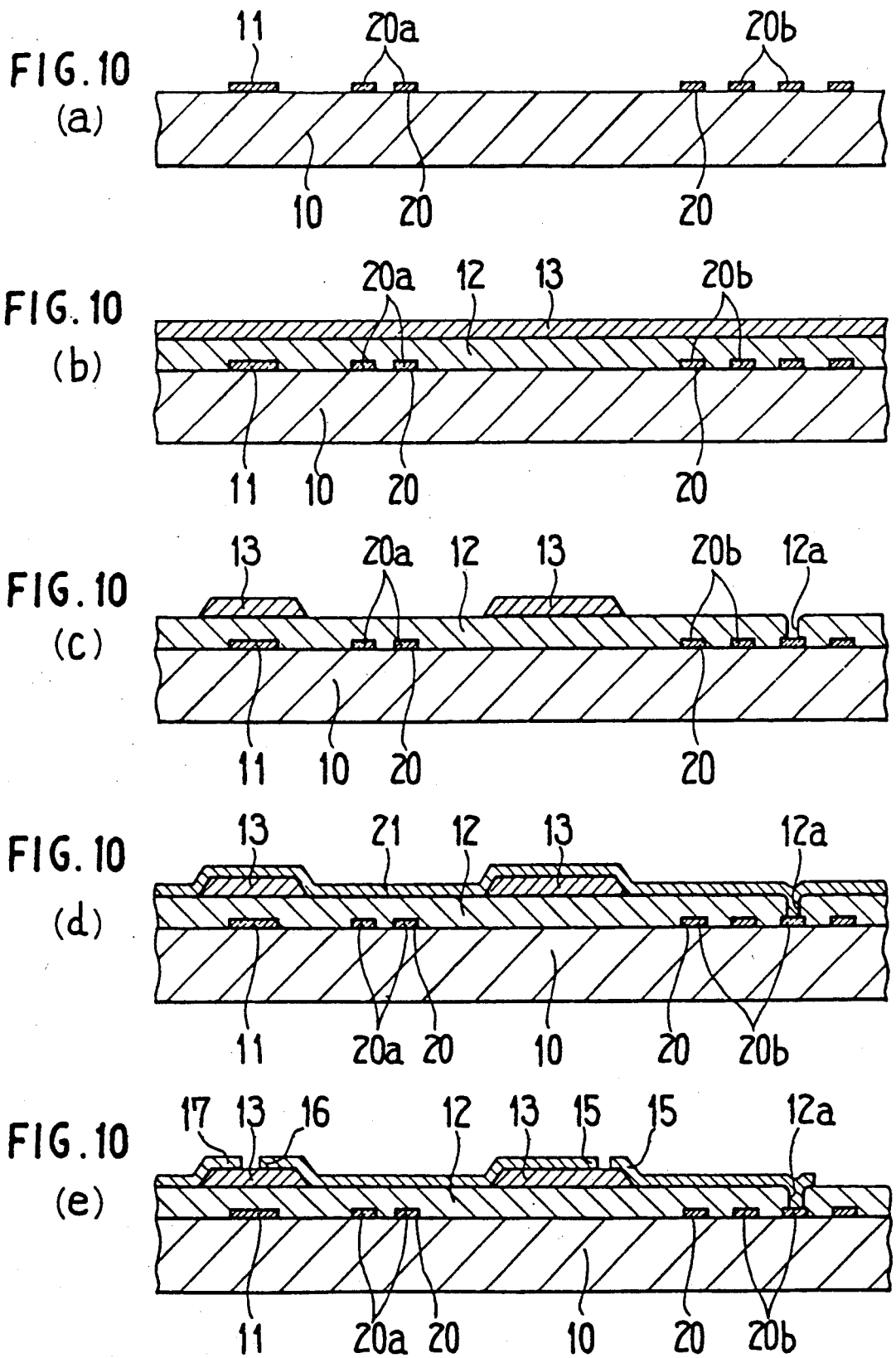
FIGS. 10 (a) to (e) are vertical sectional side views showing a fourth embodiment of the photoelectric conversion device of the present embodiment with respect to its manufacturing process.
Figure 11:
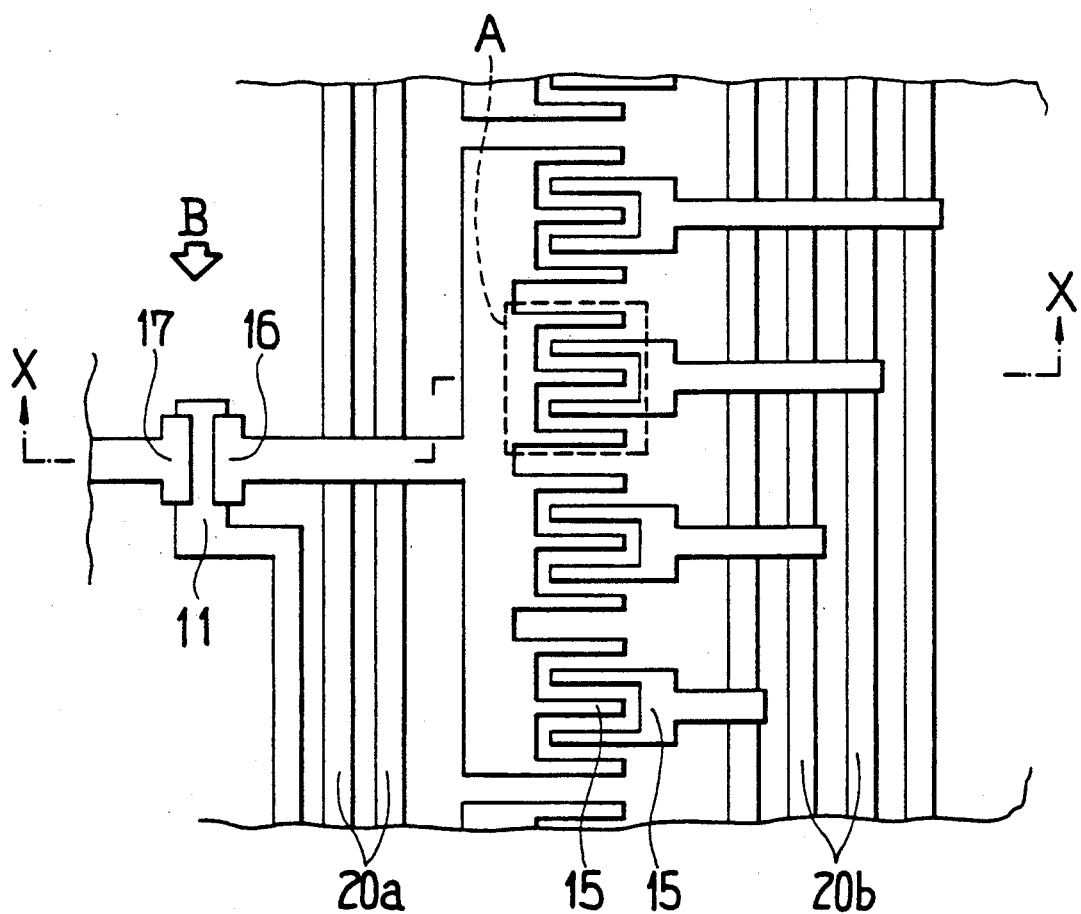
FIG. 11 is a plan view showing the same after completion.
Figure 12:
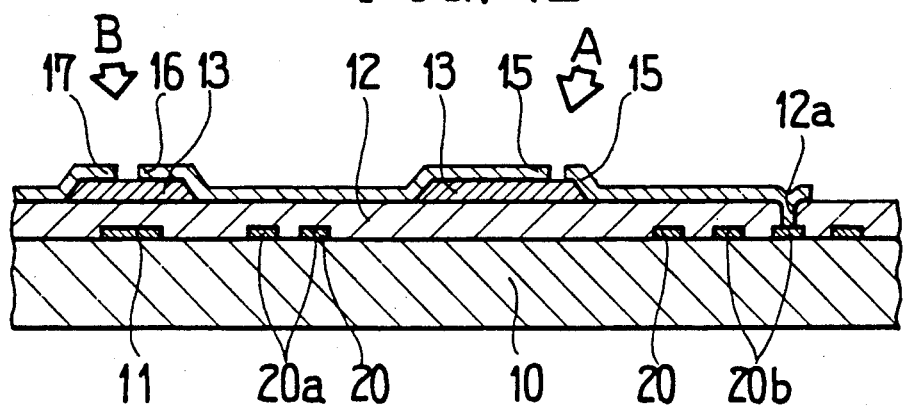
FIG. 12 is a sectional view taken along line X—X of FIG. 10.

Now, a fourth embodiment of the present invention will be described with reference to FIGS. 10 (a) to (e) to FIG. 13. The present invention is such that the lead patterns 20 are also deposited in the form of thin films on the insulating substrate 10. The manufacturing process is shown in FIGS. 10 (a) to (e). First, as shown in FIG. 10 (a), after an insulating substrate 10 has been provided thereon with a metallic film of Cr, Ti, Mo, or the like by evaporation, sputtering, or the like, the same is subjected to photoetching, and thereby the gate electrodes 11 and the lead patterns 20 are formed. The lead patterns 20 are constituted of a gate wiring pattern 20a including the gate electrodes 11 as its portion and the wiring pattern 20b under the matrix connected with the sensor portion A. Then, as shown in FIG. 10 (b), an insulating film 12 and an a-Si film 13 are deposited on the insulating substrate 10 by turns. Then, as shown in FIG. 10 (c), the insulating film 12 and the a-Si film 13 are subjected to etching and made into a predetermined pattern. That is, the etching is made so that predetermined through holes 12a communicating with the wiring pattern 20b under the matrix may be made in the insulating film 12 and, as to the a-Si film 13, only the sensor portion A and the thin film transistor portion B may be left intact. In succession thereto, as shown in FIG. 10 (d), a film of Ti, Mo, Cr, or the like becoming the upper electrodes 21 is deposited, and the film is etched into a specified pattern as shown in FIG. 10 (e), whereby such electrodes as counter electrodes 15, source electrodes 16, and drain electrodes 17 are formed. At this time, the counter electrodes 15 runs through the through hole 12a, whereby a necessary connection between the counter electrode 15 itself and the wiring pattern 20b under the matrix is provided. A plan view of the same after completion is shown in FIG. 11 and a sectional view taken along line X—X of FIG. 11 is shown in FIG. 12.

Figure 13:
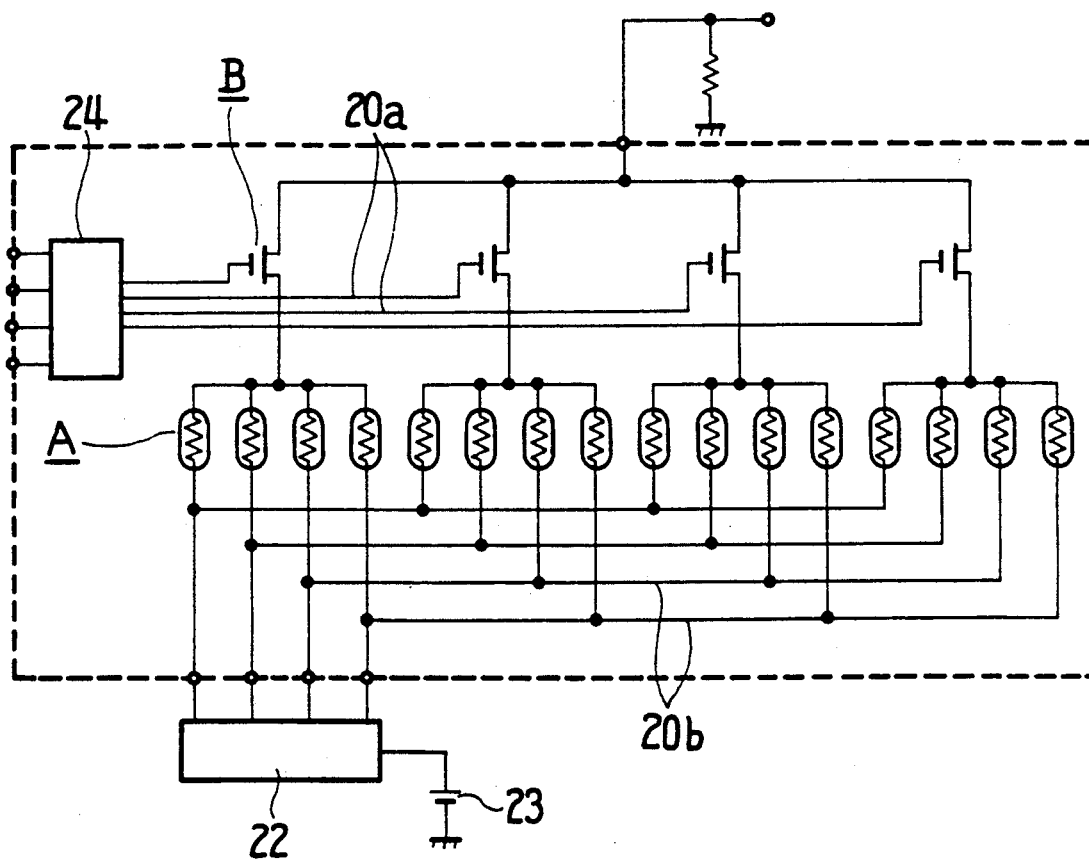
FIG. 13 is a connection diagram for the same.
Figure 14:
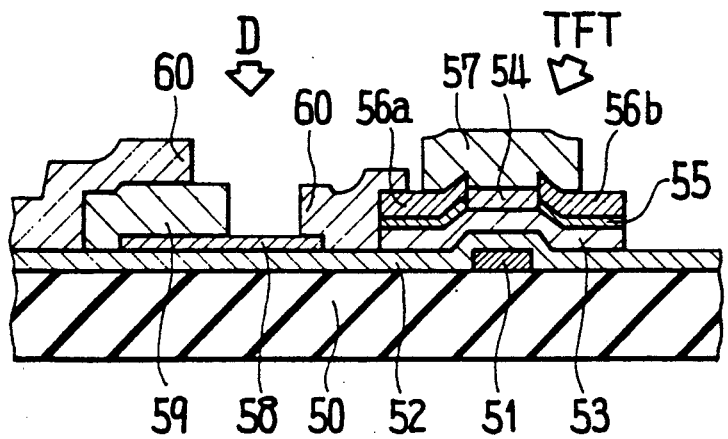
FIG. 14 is a vertical sectional side view showing sensor portion and thin film transistor portion of an example of the prior art.
Figure 15:
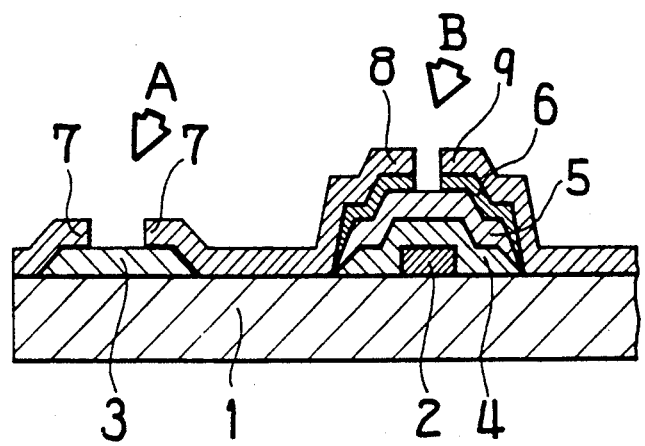
FIG. 15 is a vertical sectional side view showing an example of those proposed construction for solving problems involved in the prior art.
Figure 16:
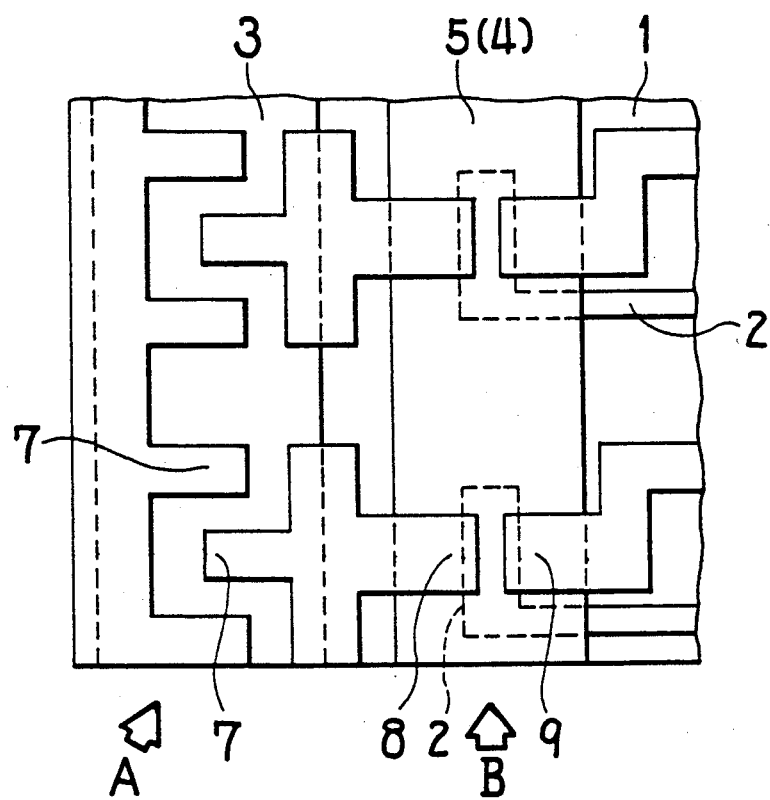
FIG. 16 is a plan view of the same.

And, a circuit diagram of the thus constructed device is shown in FIG. 13. The wiring pattern 20b under the matrix connected with the counter electrode 15 at its one end is connected at the other end with a power source 23 through a scan drive circuit 22. And, the gate wiring pattern 20a connected with the thin film transistor portion B at its one end is connected at the other end with a transistor drive IC 24.

Since the lead patterns 20 are previously provided on the insulating substrate 10 in the form of thin films in the present embodiment, fine lead patterns 20 can be easily formed.

What is claimed is:
1. A method for manufacturing a photoelectric conversion device comprising the steps of:
   forming gate electrodes for a thin film transistor portion on the surface of an insulating substrate by a thin film technique;
   depositing an insulating film on said substrate and said gate electrodes;
   depositing on said insulating film an a-Si film for said thin film transistor portion and a sensor portion so as to be commonly laminated thereto; and
   depositing on said a-Si film electrodes for said sensor potion and said thin film transistor portion so as to be commonly laminated thereto.
2. A method for manufacturing a photoelectric conversion device according to claim 1, wherein an n+ a-Si film and an electrode material for forming electrodes are provided by turns so as to be laminated to said a-Si film, then said electrode material is partly removed with portions for said electrodes left intact, and then said n+ a-Si film is likewise removed partly with portions for said electrodes left intact.
3. A method for manufacturing a photoelectric conversion device comprising the steps of:

forming gate electrodes for a thin film transistor portion on the surface of an insulating substrate by a thin film technique;

depositing an insulating film on said substrate and said gate electrodes;

depositing on said insulating film an a-Si film for said thin film transistor portion and a sensor portion so as to be commonly laminated thereto; and removing said a-Si film partly with the portions required for said sensor portion and said thin film transistor portion left intact; and depositing on said a-Si film electrodes for said sensor portion and said thin film transistor portion and said insulating film so as to be commonly laminated thereto.

4. A method for manufacturing a photoelectric conversion device comprising the steps of:

simultaneously forming gate electrodes for a thin film transistor portion and a reflecting film for a sensor portion on the surface of an insulating substrate by a thin film technique;

depositing an insulating film on said substrate, said gate electrodes, and said reflecting film;

depositing on said insulating film an a-Si film for said thin film transistor portion and said sensor portion so as to be commonly laminated thereto; and depositing on said a-Si film electrodes for said sensor portion and said thin film transistor portion so as to be commonly laminated thereto.

5. A method for manufacturing a photoelectric conversion device comprising the steps of:

commonly forming, by a thin film technique, a wiring pattern under a matrix and a gate wiring pattern including gate electrodes for a thin film transistor portion as its portion on the surface of an insulating substrate;

depositing an insulating film on said substrate, wiring pattern under the matrix, and said gate wiring pattern;

making through holes in said insulating film for communicating with said wiring pattern under the matrix or said gate wiring pattern at predetermined positions;

depositing on said insulating film an a-Si film for said thin film transistor portion and a sensor portion so as to be commonly laminated thereto; and depositing on said a-Si film and said insulating film electrodes for said sensor portion and said thin film transistor portion so as to be commonly laminated thereto, of which specified ones are led through said through holes.

* * * * *